United States Patent [19]

Cho et al.

[11] Patent Number: 4,612,274

[45] Date of Patent: Sep. 16, 1986

[54] ELECTRON BEAM/OPTICAL HYBRID LITHOGRAPHIC RESIST PROCESS IN ACOUSTIC WAVE DEVICES

[75] Inventors: Frederick Y. Cho, Scottsdale; John R. Joseph, Fountain Hills; Philip A. Seese, Phoenix, all of Ariz.

[73] Assignee: Motorola, Inc., Schaumburg, Ill.

[21] Appl. No.: 799,366

[22] Filed: Nov. 18, 1985

[51] Int. Cl.⁴ .............................................. G03C 5/00
[52] U.S. Cl. ................................. 430/296; 430/312; 430/314; 430/318; 430/329; 430/394; 430/942
[58] Field of Search ............... 430/296, 312, 313, 314, 430/318, 323, 324, 394, 329

[56] References Cited

FOREIGN PATENT DOCUMENTS 54-162460 12/1979 Japan ................... 430/314

OTHER PUBLICATIONS

Lyman, "Optical Lithography Refuses to Die", Electronics, Oct. 1985, pp. 36–39.
Itoh et al, "Fabrication Process for Saw Filters having 0.5 in Finger Period Electrodes", J. Vac. Sci. Technol., 20(1), 1982.
Reekstin et al, "Hybrid Lithography" Solid State Tech., 2nd Aug. 1981.
Mochiji et al, "Negative Patterning of AZ1350J by E-Beam Desensitization . . . ", Japanese J. Applied Physic, vol. 20, 1981.
Berker et al, "Dual-Polarity, Single-Resist Mixed (E--Beam/Photo) Lithography", IEEE Electron Device Letters, EDL-2(11), 1981.
Henderson et al, "Short Channel N-MOS Device Via Combined E-Beam . . . ".

Primary Examiner—John E. Kittle
Assistant Examiner—José G. Dees
Attorney, Agent, or Firm—Raymond J. Warren

[57] ABSTRACT

A method is disclosed for using a combination of electron beam and photo lithography in making a acoustic wave device. The process is preformed by first using a positive photoresist and electron beam writing to designate the fine lines required in acoustic wave devices. Next, a second photoresist and optical lithography are used to delineate the pad areas.

5 Claims, 12 Drawing Figures

ELECTRON BEAM/OPTICAL HYBRID LITHOGRAPHIC RESIST PROCESS IN ACOUSTIC WAVE DEVICES

BACKGROUND OF THE INVENTION

This invention relates in general to a hybrid lithographic process, and more particularly to a hybrid lithographic process for producing acoustic wave devices.

In the semiconductor industry optical lithography techniques are widely used for patterning semiconductor substrates or for patterning thin layers of material overlying semiconductor substrates, PC boards, and the like. In the conventional optical lithography process a layer of photoresist is applied and portions of the photoresist material are exposed, usually through a mask, to cause exposed portions to have different dissolution rates in a photoresist developer, one of the exposed or unexposed portions is removed to leave a patterned mask layer on the underlying material. The patterned photoresist layer then may be used as an etch mask, ion implant mask, metal lift-off mask, or the like.

It has been conventional for a number of years to optically expose the photoresist layer through a mask. Exposure is accomplished with actinic radiation, usually having an intensity peak in the ultra violet spectral region. As the semiconductor technology progresses, there arises a need for producing patterns having very small size or critical dimension. As the size of the photoresist patterns decreases to a range of less than one micrometer it becomes impossible to resolve such small sizes with optical techniques.

In view of the limitations on optical techniques, some work has been done on the use of electron beam exposure of the photoresist layer. Electron beam exposure is capable of delineating fine pattern geometries, but has the disadvantage that exposure of large areas is very time consuming because the exposure is made with an electron beam of small cross sectional area. Because of the nature of resist materials, an all electron beam exposure process would, in many cases, require the time consuming exposure of large areas.

Resist materials can be classified as either negative or positive resist. With negative resist, the unexposed resist portion is removed during the developing process; with positive resists, the opposite is true and only the unexposed portions remain after developing. In developing a pattern, such as a pattern on a complex acoustic wave device, in which fine geometries are required but in which only a small proportion of the total surface area is to remain covered, the use of negative resists and an electron beam exposure process are advantageous. The electron beam provides the necessary high resolution pattern but only a small portion of the resist layer would have to be exposed. To use a positive resist in this application would require the time consuming exposure of a large proportion of the substrate area.

To achieve the high resolution obtainable with electron beam resist exposure and yet maintain a production capable process having high throughput, it is desirable to combine electron beam and optical lithography in a single hybrid process. Others have disclosed the use of hybrid technology, but prior art process have not been entirely satisfactory.

In one disclosed process using a single layer of resist, a positive resist has been used; but in the electron beam exposure portion of the process the resist has been reversed from positive to negative. Optical processing then proceeds in a normal manner as with any positive resist. This process has the disadvantage of poor resolution, decreased resist contrast, and the need for higher, and thus longer, electron beam does.

In another disclosed process only a single layer of positive resist is used. In this process the area immediatly surrounding the fine lines is exposed with an electron beam and the remaining area to be removed is exposed with an optical process. The two exposed areas are then removed. This process has the disadvantage of being difficult to regulate to insure the proper areas are exposed.

SUMMARY OF THE INVENTION

Accordingly, it is an object of the present invention to provide a process that will overcome the problems set out above through the use of an improved hybrid lithographic process combining electron beam and optical lithography.

A further object of the present invention is to provide a hybrid process that can be used in acoustic wave devices.

Another object of the present invention is to provide a more economical hybrid process for use in developing devices.

A particular embodiment of the present invention consists of a hybrid process of electron beam and optical lithography for making acoustic wave devices comprising the steps of: coating an Aluminum film with an electron beam sensitive positive photoresist; exposing the fine line areas by use of an electron beam lithographic process; developing the acoustic wave device removing the exposed areas; coating the device with Titanium; removing the positive photoresist; coating the device with a second, optical sensitive, photoresist; masking a pad area; developing the second photoresist using optical lithography; etching the exposed Aluminum with an etchant which preferentially etches the Aluminum and not Titanium; and removing the remaining portion of the second photoresist.

DETAILED DESCRIPTION OF THE INVENTION

Figure 1:
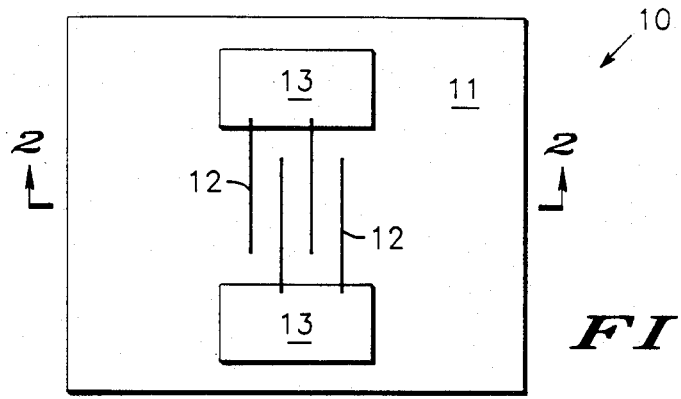
FIG. 1 is a top view of an acoustic wave device embodying the present invention.
Figure 2A:
FIGS. 2A-2J is a series of cross-sectional views of the process used to make the acoustic wave device shown in FIG. 1.
Figure 2B:
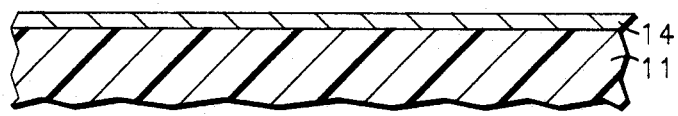
Figure 2C:
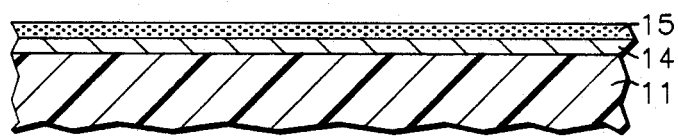
Figure 2D:
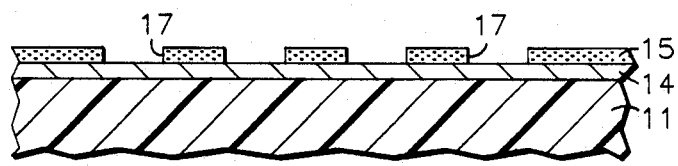
Figure 2E:
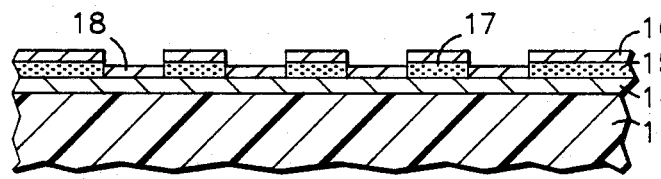
Figure 2F:
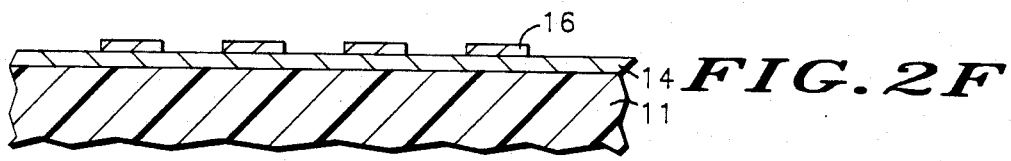
Figure 2G:
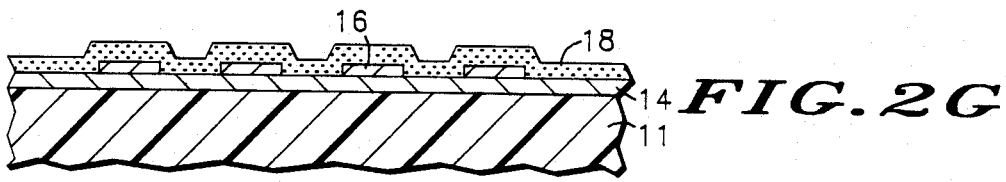
Figure 2H:
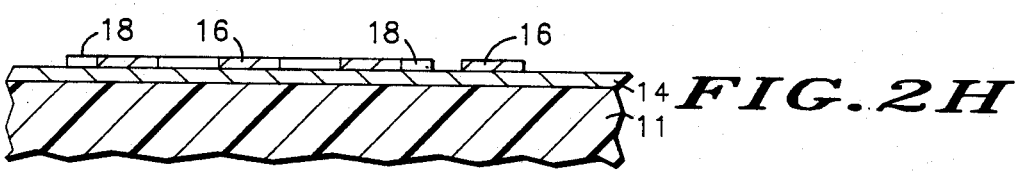
Figure 2I:
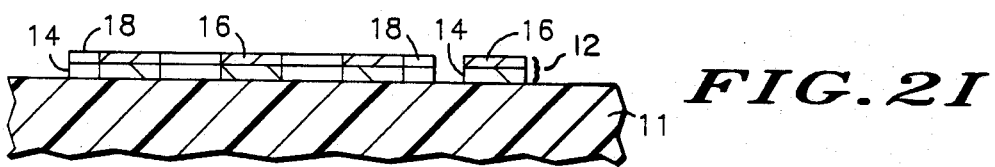
Figure 2J:
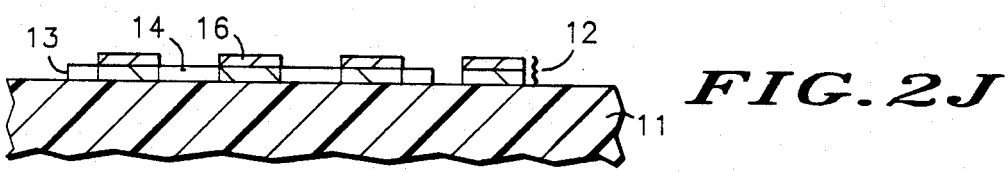

Referring to the diagram of FIG. 1 a top view of an acoustic wave device 10, embodying the present invention, is illustrated. Acoustic wave device 10 consists of a substrate 11, such as a piezoelectric or the like; a set of fine lines 12, made of Titanium over Aluminum, on the order of one-half micron; and a pair of bonding pads 13, made of Aluminum or the like.

Referring now to FIG. 2, the process of developing acoustic wave device 10 is illustrated in the cross-sectional drawings A-J. First, in diagram A, substrate 11 is illustrated. Substrate 11 can be a piezoelectric or the like. Next, a layer of Aluminum (Al) 14 is deposited on substrate 11, diagram B, by evaporation or like technique. A layer of electron beam sensitive positive photoresist 15 is then placed on top of Aluminum layer 14.

Photoresist 15 is generally of a type known in the industry as PMMA or polymethylmethacrylate, but may be a similar type of photoresist.

Next, PMMA layer 15 is exposed using an electron beam, not shown. The electron beam exposes the portions of resist 15 that will be removed thereby delineating fine lines 12. Acoustic wave device 10 is then developed causing the portions of resist 15 that were exposed to be removed leaving resist 15 having walls designated 17. This results in the cross sectional area shown in diagram D, FIG. 2.

A layer of metal, such as Titanium (Ti) 16 is then placed over resist 15. Titanium 16 serves to protect the underlying Aluminum 14 and to act as a mask later. As shown in diagram E, FIG. 2, Titanium 16 is only placed on the surface of resist 15 or the exposed surface of Aluminum 14, not on walls 17 of resist 15.

The remaining resist layer 15 is then removed which leaves substrate 11, Aluminum 14, and Titanium lines 16. This is shown in diagram F, FIG. 2. The portions of Titanium 16 that were disposed on top of resist 15 were also removed in this process. The requirement of having little or no Titanium 16 on walls 17 of resist 15 is to prevent resist 15 from being removed and leaving Titanium 16 connecting lines 12, FIG. 1.

Figure 3:
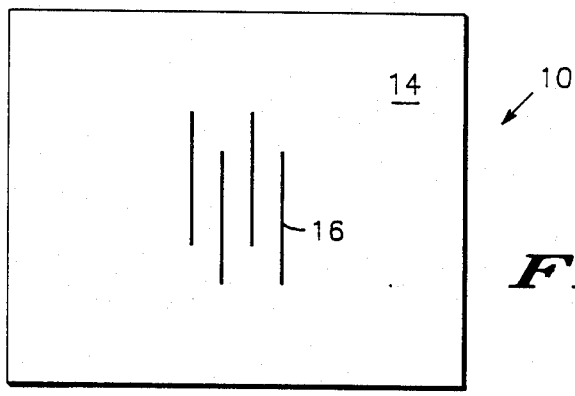
FIG. 3 is a top view of an intermediate step in the process illustrated in FIGS. 2A-2J.

A top view of acoustic wave device 10 corresponding to that shown in diagram F, FIG. 2, is illustrated in FIG. 3. As shown acoustic wave device 10 now consists of Aluminum layer 14 having Titanium lines 16 disposed thereon.

A layer of a light sensitive second photoresist 18 is next placed on Aluminum layer 14 covering Titanium lines 16. The pad areas 13, FIG. 1, are then delineated by a mask using the standard optical lithographic technique, not shown. Acoustic wave device 10 is then developed causing photoresist 18 disposed around pad areas 13 to be removed. This can be seen in diagram H, FIG. 2 where resist 18 designates were pad 13 will eventually remain.

Next, the exposed areas of Aluminum 14 are etched away leaving the device shown in diagram I, FIG. 2. This device has the substrate 11; fine lines 12 which are made of a layer of Aluminum 14 and Titanium 16; a layer of resist 18; and an Aluminum pad 14.

Finally, the remaining photoresist 18 is removed leaving the final acoustic wave device 10 as shown in diagram J, FIG. 2. As shown in diagram J, acoustic wave device 10 consists of substrate 11; pad 13 which is composed of Aluminum 14; and fine lines 12 which are made of Aluminum 14 and Titanium 16. As can be seen in FIG. 1, the Titanium layer of fine lines 12 extends partly onto pads 13. This provides an improved electrical contact between fine lines 12 and pads 13.

Titanium 16 serves two purposes: first, it protects the fine lines of Aluminum 14; and second, it provides a larger cross-sectional area for the fine line conductors. The latter allows acoustic wave device to operate at higher current levels that would not otherwise be possible. Since pads 13 have a much larger cross-sectional area there is no need to have a Titanium coating. This provides for a more economical use of the Titanium.

Thus, it is apparent to one skilled in the art that there has been provided in accordance with the invention, a method that fully satisfies the objects, aims and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

We claim:

1. A hybrid process of electron beam and optical lithography for making acoustic wave devices comprising the steps of:

providing a substrate;

placing a layer of Aluminum on said substrate;

placing a layer of positive photoresist on said layer of Aluminum;

exposing a portion of said positive photoresist with an electron beam delineating a fine line of one micron or less;

developing said positive photoresist removing said exposed portion of said positive photoresist causing a first portion of said Aluminum layer to be exposed;

placing a layer of Titanium over the surface of a remaining portion of said positive photoresist and the exposed surface of said Aluminum;

removing said remaining portion of said positive photoresist causing the Titanium disposed on the surface of said positive photoresist to be removed and exposing a second portion of said Aluminum;

placing a layer of a second photoresist over said second portion of said Aluminum and over a remaining portion of said Titanium;

masking a portion of said second photoresist designating a pad area;

exposing said second photoresist using an optical lithographic technique;

developing said second photoresist causing a remaining portion of said second photoresist to be removed;

etching said Aluminum causing a portion of said Aluminum to be removed from said acoustic wave device, leaving a portion of said Aluminum disposed below said portion of said second photoresist and a portion of said Aluminum disposed below said remaining portion of said Titanium; and removing said portion of said second photoresist.

2. The hybrid process of claim 1 wherein said positive photoresist is polymethylmethacrylate (PMMA).

3. A hybrid process of electron beam and optical lithography for making acoustic wave devices comprising the steps of:

providing a substrate;

placing a layer of Aluminum on said substrate;

placing a layer of positive photoresist on said layer of Aluminum;

exposing a portion of said positive photoresist with an electron beam delineating a fine line of one micron or less;

developing said positive photoresist removing said exposed portion of said positive photoresist causing a first portion of said Aluminum layer to be exposed;

placing a layer of metal over the surface of a remaining portion of said positive photoresist and the exposed surface of said Aluminum;

removing said remaining portion of said positive photoresist causing the metal disposed on the surface of said positive photoresist to be removed and exposing a second portion of said Aluminum;

placing a layer of a second photoresist over said second portion of said Aluminum and over a remaining portion of said metal;

masking a portion of said second photoresist designating a pad area;

exposing said second photoresist using an optical lithographic technique;

developing said second photoresist causing a remaining portion of said second photoresist to be removed;

etching said Aluminum causing a portion of said Aluminum to be removed from said acoustic wave device, leaving a portion of said Aluminum disposed below said portion of said second photoresist and a portion of said Aluminum disposed below said remaining portion of said metal;

removing said portion of said second photoresist; and removing said remaining portion of said metal.

4. The hybrid process of claim 3 wherein said metal is Titanium.

5. The hybrid process of claim 3 wherein said positive photoresist is polymethylmethacrylate (PMMA).

* * * * *